United States Patent
O'Connor et al.

(10) Patent No.: US 8,742,789 B2
(45) Date of Patent: Jun. 3, 2014

(54) INTERCONNECTED ARRAY OF LOGIC CELLS RECONFIGURABLE WITH INTERSECTING INTERCONNECTION TOPOLOGY

(75) Inventors: Ian O'Connor, Jassans Riottier (FR); Nataliya Yakimets, Ecully (FR)

(73) Assignees: Ecole Centrale de Lyon, Ecully Cedex (FR); Universite Claude Bernard, Villeurbanne Cedex (FR); Centre National de la Recherche Scientfique, Paris (FR); Institut National des Sciences Appliquees de Lyon, Villeurbanne (FR)

( * ) Notice: Subject to any disclaimer, the term of this patent is extended or adjusted under 35 U.S.C. 154(b) by 0 days.

(21) Appl. No.: 13/512,967

(22) PCT Filed: Dec. 14, 2010

(86) PCT No.: PCT/FR2010/052717
§ 371 (c)(1),
(2), (4) Date: Aug. 7, 2012

(87) PCT Pub. No.: WO2011/080452
PCT Pub. Date: Jul. 7, 2011

(65) Prior Publication Data
US 2012/0326749 A1    Dec. 27, 2012

(30) Foreign Application Priority Data
Dec. 14, 2009    (FR) ...................................... 09 58957

(51) Int. Cl.
*H01L 25/00*    (2006.01)
*H03K 19/177*    (2006.01)
*G06F 17/50*    (2006.01)

(52) U.S. Cl.
USPC ............... 326/41; 326/38; 326/101; 716/126

(58) Field of Classification Search
USPC ............... 326/37–41, 101; 716/126; 327/564
See application file for complete search history.

(56) References Cited

U.S. PATENT DOCUMENTS

| | | | |
|---|---|---|---|
| 5,208,491 A * | 5/1993 | Ebeling et al. | ................. 326/41 |
| 5,296,759 A | 3/1994 | Sutherland et al. | |
| 5,323,069 A * | 6/1994 | Smith, Jr. | ..................... 326/47 |
| 5,451,887 A | 9/1995 | El-Avat et al. | |
| 5,543,640 A | 8/1996 | Sutherland et al. | |
| 5,825,202 A * | 10/1998 | Tavana et al. | ................. 326/39 |

(Continued)

FOREIGN PATENT DOCUMENTS

EP    1 143 336    10/2001

*Primary Examiner* — Alexander H Taningco
*Assistant Examiner* — Dylan White
(74) *Attorney, Agent, or Firm* — Ladas & Parry LLP (57) ABSTRACT

An interconnected array of reconfigurable logic cells which carry out at least one logic function, externally connected to peripheral connection network equipped with switch boxes and connected to programmable input/output blocks. The logic cells are distributed in a first dimension in rows i with i=1 to d and a second dimension in columns j with j=1 to w, with d≤2 and w=2 or d=2 and w≤2, each logic cell including a second input, a second input, a first output and a second output, the first input of each logic cell and the first output of each logic cell being connected to the connection network, the second input and the second output of each logic cell being connected to other different column and row logic cells except for the first and last rows or columns for d>2 or w>2 respectively.

7 Claims, 5 Drawing Sheets

(56) References Cited

U.S. PATENT DOCUMENTS

| | | | |
|---|---|---|---|
| 5,894,565 A * | 4/1999 | Furtek et al. | 326/38 |
| 6,184,712 B1 * | 2/2001 | Wittig et al. | 326/41 |
| 6,292,018 B1 * | 9/2001 | Kean | 326/41 |
| 6,380,759 B1 * | 4/2002 | Agrawal et al. | 326/41 |
| 6,864,710 B1 * | 3/2005 | Lacey et al. | 326/39 |
| 6,930,510 B2 * | 8/2005 | New | 326/41 |
| 7,068,072 B2 * | 6/2006 | New et al. | 326/47 |
| 7,253,658 B1 * | 8/2007 | Young | 326/38 |
| 7,477,073 B1 * | 1/2009 | Tuan et al. | 326/41 |
| 7,948,265 B1 * | 5/2011 | Young et al. | 326/38 |
| 8,183,882 B2 * | 5/2012 | Teig et al. | 326/38 |
| 8,415,976 B1 * | 4/2013 | Trimberger | 326/41 |
| 2002/0171451 A1 | 11/2002 | Hamano et al. | |
| 2006/0164120 A1 * | 7/2006 | Verma et al. | 326/41 |
| 2010/0194430 A1 | 8/2010 | O'Connor et al. | |

* cited by examiner

INTERCONNECTED ARRAY OF LOGIC CELLS RECONFIGURABLE WITH INTERSECTING INTERCONNECTION TOPOLOGY

This application is a 371 of PCT/FR2010/052717, filed on Dec. 14, 2010, which claims priority to French patent application number 09 58957, filed Dec. 14, 2009, which is incorporated herein by reference.

The present invention relates to the general technical field of reconfigurable logic cells comprising a plurality of inputs and the capable of carrying out a certain number of logic functions allowing processing of the logic signal provided on their inputs and applying output signals on a plurality of outputs.

The object of the invention more specifically relates to networks or arrays of reconfigurable logic cells including an interconnection network between the cells and provided with switch boxes connected to programmable input/output blocks.

In the field of integrated circuits, the production cost is essentially due to the cost of the design of the masks useful for lithography and to the cost of the automatic equipment used for producing the integrated circuits notably the photolithography apparatuses. These production costs regularly increase because of the complexity of the proposed architectures and of the search for miniaturization of these integrated circuits.

In order to reduce the impact of the cost of the masks, programmable or reconfigurable logic circuits were developed, which provide good tolerance to faults and allow reuses for different applications. Such types of architecture exist for such circuits such as for example the FPGA (Field Programmable Gate Array) circuit, the CPLD (Complex Programmable Logic Device) circuit or further the PLA (Programmable Logic Array) circuit.

Such reconfigurable logic circuits are experiencing a spectacular development notably because of their flexibility and of their less complex design than those of dedicated circuits such as ASICs (Application Specific Integrated Circuits).

These reconfigurable logic circuits include logic cells in a large number freely assembled and connected together through interconnection networks. These reconfigurable logic cells give the possibility of achieving any desired logic functions. These logic cells resort to various technologies and for example use Hall effect devices or even CNTFET (Carbon Nano Tube FET) devices or further RTD (Resonant Tunneling Diode) components in combination with an HFET (Heterostructure FET) component, an NWFET (NanoWire FET) component, DG MOSFET (Dual Gate MOSFET) component.

For example, document EP 1 143 336 describes an FPGA logic circuit for which the connection network includes cells each having eight inputs and eight outputs, requiring sixteen transmission routes.

Also, patent U.S. Pat. No. 5,296,759 describes a configuration of a network connection of cells each including eight inputs and eight outputs.

U.S. Pat. No. 7,253,658 describes cells connected according to configurable interconnections produced via transmission multiplexes and requiring resorting to addition circuits such as multiplexers and buffers for the switching elements.

Conventionally, each logic cell is directly connected through a switch box in order to allow a complete configuration (cf. U.S. Pat. No. 5,543,640). This approach leads to an inflation of active components/connection surface area ratio, which leads to an increase in the programming times, to a loss of efficiency in terms of rate and to a loss of logic efficiency per unit surface.

In order to find a remedy to these drawbacks, the article of P-E. GAILLARDON, I. O'CONNOR, J. LIU et al. (Interconnection scheme and associated mapping method of reconfigurable cell matrices based on nanoscale devices) IEEE/ACM International Symposium on Nanoscale Architectures, pp.69-74, 2009 indicates different topologies for interconnection of arrays of logic cells.

This novel approach aims at grouping logic cells in networks or arrays according to architectures giving the possibility of meeting the requirements of success rate, of diversity in the produced logic functions and of increase in the surface area efficiency used by the relative reduction in the implantation surface area of the interconnection networks as compared with that of logic cells.

For example, the document of J. Greg Nash. « Automatic Latency-Optimal design of FPGA- based Systolic Arrays». Proceedings of the 10th Annual IEEE Symposium on Field-Programmable Custom Computing Machines (FCCM'02), pp. 299, 2002 describes an interconnected array of logic cells connected together along two directions and connected to a peripheral connecting network. The external connection of one of the inputs of the logic cells is made along one dimension while the external connection of the other input of the logic cells is made along the other dimension. Similarly, the external connection of one of the outputs of the logic cells is made along one dimension while the external connection of the other output of the cells is made along the other dimension. The consequence is that the input of the logic cells of the array is only available along a single direction thereby limiting access to the logic cells. Moreover, such a topology does not allow a complete internal connection between the logic cells thereby limiting the logic depth, i.e. the number of logic operations carried out in cascade.

In order to find a remedy to these drawbacks, the object of the invention proposes a novel topology of interconnected arrays of logic cells, in particular allowing access in terms of external connection along both directions of the array while having a complete internal connection between the logic cells in order to retain a diversity of configurations so as to attain large values of logic depths.

In order to attain such a goal, the object of the invention relates to an interconnected array of reconfigurable logic cells carrying out at least one logic function, externally connected to a peripheral connecting network equipped with switch boxes and connected to programmable input/output blocks.

According to the invention, the logic cells [i, j] are distributed along a first dimension in rows i with i=1 to d and a second dimension in columns j with j=1 to w, with d≥2 and w=2 or d=2 and w≥2, each logic cell including a first input, a second input, a first output and a second output, the first input of each logic cell and the first output of each logic cell being connected to the connecting network, the second input and the second output of each logic cell being connected to other different column and row logic cells except for the first and last rows or columns for d>2 or w>2, respectively, through an intersecting interconnection topology between both columns of the array for w=2 and between both rows of the array for d=2 and for successively oscillating along one direction and along a reverse direction, so that the logic depth of the logic functions is comprised between 1 and 2×d or between 1 and 2×w.

This interconnected array of logic cells has, as compared with the prior solutions, the following advantages:

the « intersecting » nature of the flow of operations gives high accessibility to the inputs and to the outputs, all the sides of the array having at least one input and one output, the logic depth of the function to be executed is not imposed by the size of the array, the execution direction of the logic function to be executed is not imposed by the interconnection structure, the consequence is that several logic functions, of the same complexity or of different complexities, may be executed simultaneously along the same direction or in different directions.

According to a first embodiment of the array including a number d of rows i with d≥2 and a number of columns equal to 2, the intersecting interconnection topology is such that:

for internal connections:
the second input of each logic cell of even row [i, 1] wherein 2<i<d et i=2 K and K∈N, is connected to the second output of the logic cell [i+1, 2] while the second input of each logic cell of odd row [i, 1] wherein 3<i<d and i=2 K+1 with K∈N, is connected to the second output of the logic cell [i−1, 2], the second output of each logic cell of even row [i, 1] wherein 2<i<d and i=2 K and K∈N, is connected to the second input of the logic cell [i−1, 2] while the second output of each logic cell of even row [i, 1] wherein 3<i<d and i=2 K+1 with K∈N is connected to the second cell input [i+1, 2].

for the connections of the first row:
the second input of the logic cell [1, 1] being connected to the second output of the logic cell [1, 2] while the second output of the cell [1, 1] is connected to the second input of the cell [2, 2], the second input of the logic cell [1, 2] being connected to the second output of the logic cell [2, 1], for the connections of the last row if d=2 K with K∈N:
the second input of the logic cell [d, 1] being connected to the second output of the logic cell [d, 2] while the second output of the logic cell [d, 1] is connected to the second input of the logic cell [d−1,2], the second input of the logic cell [d, 2] being connected to the second output of the logic cell [d−1, 1], for connections of the last row if d=2 K+1 with K∈N:
the second input of the logic cell [d, 1] is connected to the second output of the logic cell [d−1, 2] while the second output of the logic cell [d, 1] is connected to the second input of the logic cell [d, 2], the second output of the logic cell [d, 2] being connected to the second input of the logic cell [d−1, 1].

According to a second embodiment of the array including a number d of rows equal to 2 and a number w of columns j with w≥2, the intersecting interconnection topology is such that:

for internal connections:
the second input of each logic cell of an even column [1, j] wherein 2<j<w and j=2 K and K∈N, is connected to the second output of the logic cell [2, j−1] while the second input of each logic cell of odd column [1, j] wherein 3<j<d and j=2 K+1 with K∈N, is connected to the second output of the logic cell [2, j+1], the second output of each logic cell of even column [1, j] wherein 2<j<w and j=2 K and K∈N, is connected to the second input of the logic cell [2, j+1] while the second output of each logic cell of an odd column [1, j] wherein 3<j<w and j=2 K+1 with K∈N is connected to the second input of cell [2, j−1], for connections of the first column:
the second input of the logic cell [1,1] being connected to the second output of the logic cell [2, 2] while the second output of the cell [1, 1] is connected to the second input of the cell [2, 1], the second output of the logic cell [2, 1] being connected to the second input of the logic cell [1, 2], for connections of the last column if w=2 K with K∈N:
the second input of the logic cell [1, w] being connected to the second output of the logic cell [2, w−1] while the second output of the logic cell [1, w] is connected to the second input of the logic cell [2, w], the second output of the logic cell [2, w] being connected to the second input of the logic cell [1, w−1], for connections of the last column if w=2 K+1 with K∈N:
the second input of the logic cell [1, w] is connected to the second output of the logic cell [2, w] while the second output of the logic cell [1, w] is connected to the second input of the logic cell [2, w−1], the second input of the logic cell [2, w] being connected to the second output of the logic cell [1, w−1].

The present invention also includes either one or both of the following features:

each logic cell performs at least one logic function selected from negation, conjunction, disjunctions, NAND, NOR, XOR, XNOR, implication or non-implication functions, all the logic cells of the array are identical, the connecting network includes two sides for connecting with the rows thus extending on either side of the first and last columns of the array on the one hand, and two sides for connecting with the columns thus extending on either side of the first and last rows of the array, for d>2, the first input and the first output of each logic cell belonging to a same column, except for logic cells of the first row and of the last row, are connected to the side for connecting with the rows close to said column while for w>2, the first input and the first output of each logic cell belonging to a same row, except for the logic cells of the first column and of the last column are connected to the side for connecting with the columns close to said row, the first input and the first output of each logic cell of the first and last rows for d>2 and of the first and last columns for w>2 are connected to the side for connecting with the close rows and to the side for connecting with the neighboring columns, the connecting network is equipped with switch boxes.

Another object of the invention also relates to an integrated circuit including at least one interconnected array according to the invention.

Diverse other features emerge from the description made below with reference to the appended drawings which show, as non-limiting examples, embodiments of the object of the invention.

Figure 1:
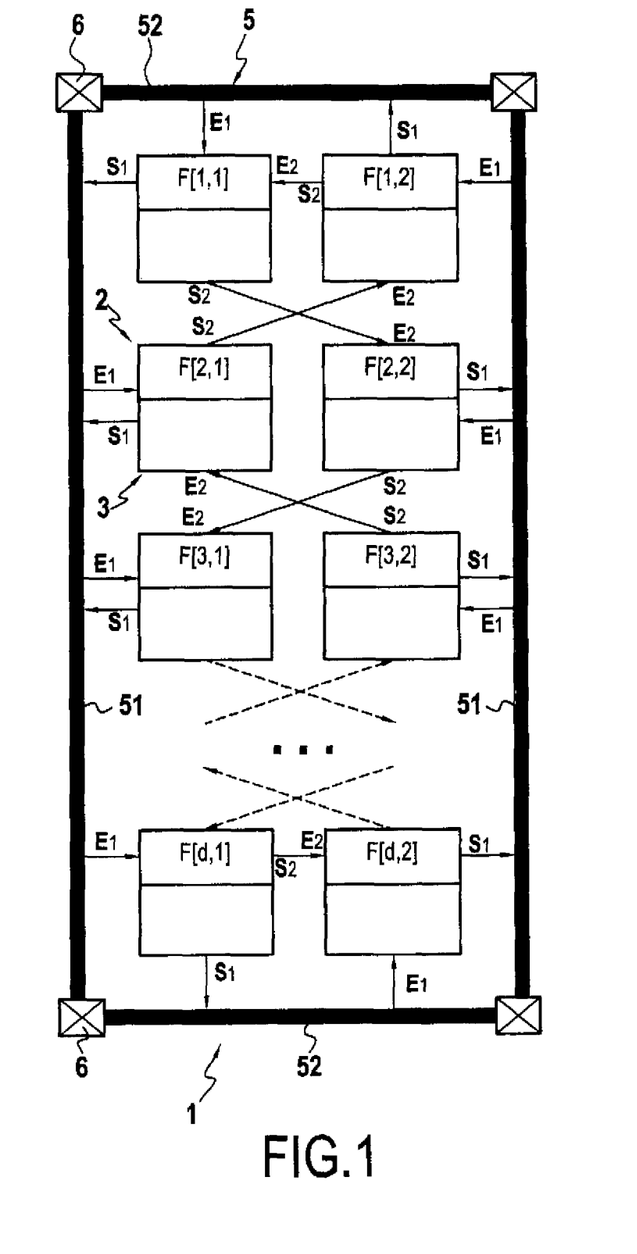
FIG. 1 illustrates a first embodiment of an interconnected array of logic cells including d rows and two columns.
Figure 2:
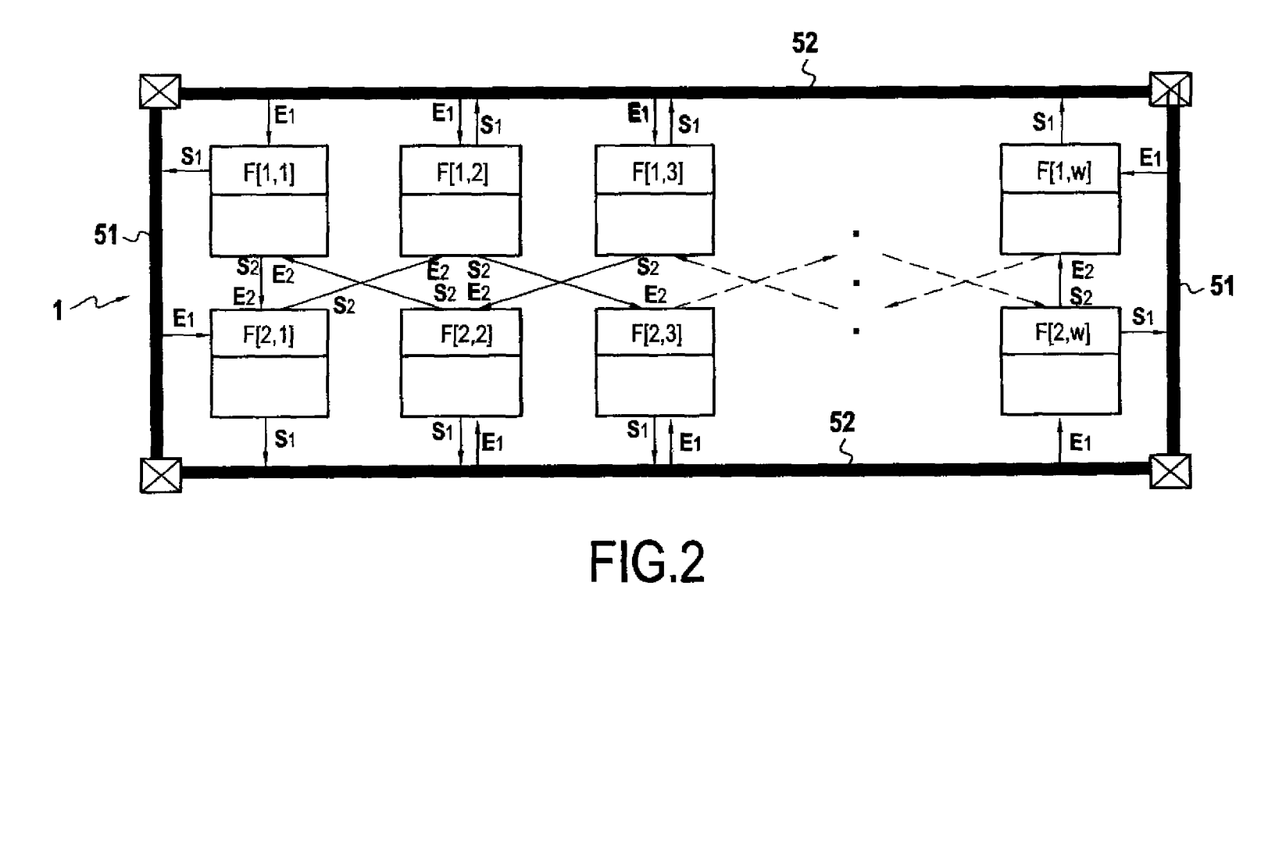
FIG. 2 illustrates a second embodiment of an interconnected array of logic cells including two rows and w columns.

The object of the invention relates to an interconnected array 1 of reconfigurable logic cells [i, j] distributed along a first dimension in rows i with i=1 to d and a second dimension in columns j with j=1 to w, with d≥2 and w=2 (FIG. 1) or with d=2 and w≥2 (FIG. 2). The numbering of the columns j and of the rows i of the array starts from the top on the left of the array and goes from left to right for the columns and from top to bottom for the rows.

FIG. 1 illustrates a first embodiment of the invention for which the array 1 includes a number d of rows i with d greater than or equal to 2 and a number w of columns j equal to 2 (w=2) while FIG. 2 illustrates a second embodiment for which the array 1 includes a number d of rows i equal to 2 (d=2) and a number w of columns j with w greater than or equal to 2. In other words, the array 1 according to the invention has in one direction a dimension equal to 2 and in another perpendicular direction a dimension comprised between 2 and d or w.

Conventionally, each logic cell [i, j] achieves a complex logic function F using one or more elementary logic functions of any types and for example taken from the negation, conjunction, disjunction, NAND, NOR, XOR, XNOR, implication or non-implication functions and represented by the following symbols:

¬ negation e.g. ¬ A=INV (inversion of) A
∧ conjunction e.g. A∧B=A AND B
∨ disjunction e.g. A∨B=A OR B
↑ NAND e.g. A↑B=A NAND B (or ¬(A∧B))
↓ NOR e.g. A↓B=A NOR B (or ¬(A∨B))
⊕ XOR e.g. A⊕B=A XOR B
↔ XNOR e.g. A↔B=A XNOR B (or ¬(A⊕B))
→ implication e.g. A→B=¬ A∨B
↛ non-implication e.g. A↛B=A∧¬ B Each logic cell covers all the types of elementary or complex logic cells such as those called CLB (Configurable Logic Block) or logic blocks consisting of a correspondence table (LUT or Look-Up-Table) or processors.

Conventionally, each logic cell [i, j] includes a data block 2 and a configuration block 3. The data block 2 includes the complex logic function F and the coordinates [i, j] of the logic cell in the array 1. The configuration block 3 allows, depending on control signals, selection of a complex logic function F among all the available configurable logic functions. According to a feature of the invention, all the logic cells making up the array 1 are identical. For example the logic cells are made with Hall effect, CNTFET, RTD, HFET, NwFET or MOSFET technologies as described for example in patent application WO 2009/013422.

Conventionally, all the logic cells of the array 1 are externally connected to a network or bus 5 for peripheral connection equipped with switch boxes 6 and connected to programmable input/output blocks not shown. The peripheral connection network 5, the switch boxes 6 and the programmable input/output blocks are not described more specifically since they are well known to one skilled in the art and do not specifically form part of the invention.

In the illustrated examples, the connecting network 5 which surrounds all the logic cells of the array 1 includes two sides 51 for connection with the rows i extending thus on either side of the first and last columns of the array on the one hand and two sides 52 for connection with the columns j thus extending on either side of the first and last rows i of the array on the other hand. Each intersection between a side 51 for connection with a row and side 52 for connection with a column is provided with a switch box 6.

Each logic cell [i, j] includes a first input E1, a second input E2, a first output S1 and a second output S2, with the first and second outputs S1 and S2 which are identical. Each logic cell [i, j] therefore only includes two inputs E1, E2 and only two outputs S1, S2.

The first input E1 of each logic cell and the first output S1 of each logic cell are connected to the connecting network 5.

Advantageously, in the first embodiment illustrated in FIG. 1 wherein the array 1 is of the d×2 type (d≥2 and w=2), the first input E1 and the first output S1 of each logic cell belonging to a same column j, except for the logic cells of the first row i and of the last row i are connected to the side for connection with the rows 51, near or located in proximity to said column.

The first input E1 and the first output S1 of each logic cell belonging to the first row i and to the last row i are respectively connected to a neighboring side for connection with the rows 51 and to a neighboring side for connection with the columns 52. As this is apparent from FIG. 1, for both logic cells belonging to the first row or to the last row i, one of the first input is connected to the neighboring side for the connection with the columns 52 while the other first input is connected to the side for connection with the neighboring rows 51 while one of the first outputs is connected to the neighboring side for connection with the columns 52 while the other first output is connected to the neighboring side for connection with the rows 51.

Advantageously, in the second embodiment illustrated in FIG. 2, wherein the array 1 is of the 2×w (w≥2 and d=2), the first input E1 and the first output S1 of each logic cell belonging to a same row, except for the logic cells of the first column and of the last column, are connected to the neighboring side for connection with the columns 52 or located in proximity to said column.

The first input E1 and the first output S1 of each logic cell belonging to the first column and to the last column are respectively connected to the neighboring side for connection with the rows 51 and to a neighboring side for connection with the columns 52. As this is apparent from FIG. 2, for both logic cells belonging to the first column or the last column, one of the first inputs is connected to the neighboring side for connection with the columns 52 while the other first input is connected to the neighboring side for connection with the rows 51 while one of the first outputs is connected to the neighboring side for connection with the columns 52 while the other first output is connected to the neighboring side for connection with the rows 51.

All the sides of the array thereby have at least one input and at least one output. The propagation of data may thus be carried out on the four sides of the array.

According to another feature of the invention, the second input E2 and the second output S2 of each logic cell are connected to other logic cells of different column and row, except for the first and last rows for the first embodiment (d≥2 et w=2) and the first and last columns for the second embodiment (d=2 and w≥2), through an intersecting interconnection topology between both columns of the array for the first embodiment and between both rows of the array for the second embodiment. This interconnection topology is intersecting and oscillating since it is successively achieved along one direction and along a reverse direction, so that the logic depth of the logic functions is comprised between 1 and 2×d or between 1 and 2×w.

Thus, for the first embodiment illustrated in FIG. 1, the second output S2 of the logic cell [1, 1] of the first row and of the first column is connected to the input E2 of the logic cell [2, 2] of the second row and of the second column in the first column—second column direction while the second output S2 of the logic cell [2, 1] of the second row and of the first column is connected to the input E2 of the logic cell [1, 2] of the first row and of the second column in the first column—second column direction. On the other hand, the second output S2 of the logic cell [2, 2] of the second row and of the second column is connected to the input E2 of the logic cell [3, 1] of the third row and of the first column in the second column—first column direction while the second output S2 of the logic cell [3, 2] of the third row and of the second column is connected to the input E2 of the logic cell [2, 1] of the second row and of the first column in the second column—first column direction.

Between two neighboring rows, the second outputs S2 of the logic cells of a same column are connecting by intersection and according to a same connection direction, to the second input E2 of the logic cells of the other column. However, the intersection achieved between the two columns changes directions or oscillates (reverse direction) during each successive connection between two neighboring rows of logic cells.

Also, for the second embodiment illustrated in FIG. 2, the second output S2 of the logic cell [2, 2] of the second row and of the second column is connected to the input E2 of the logic cell [1, 1] of the first row and of the first column in the second row—first row direction while the second output S2 of the logic cell [2, 1] of the second row and of the first column is connected to the input E2 of the logic cell [1,2] of the first row and of the second column in the second row—first row direction. On the other hand, the second output S2 of the logic cell [1, 2] of the first row and of the second column is connected to the input E2 of the logic cell [2, 3] of the second row and of the third column in the first row—second row direction, the second output S2 of the logic cell [1, 3] of the first row and of the third column is connected to the input E2 of the logic cell [2, 2] of the second row and of the second column in the first row—second row direction.

Between two neighboring columns, the second outputs S2 of the logic cells of the same row are connected by intersection and according to a same connection direction, to the second inputs E2 of the logic cells of the other row. However, the intersection direction achieved between both rows changes direction or oscillates along a reverse direction during each successive connection between two neighboring columns of logic cells.

More specifically, for the first embodiment illustrated in FIG. 1, i.e. for an array including a number d of rows i with d≥2 and a number w of columns j equal to 2 (w=2), the intersecting interconnecting topology is such that:
  for internal connections:
    the second input E2 of each logic cell of an even row [i, 1] wherein 2<i<d and i=2 K and K∈N, is connected to the second output S2 of the logic cell [i+1, 2] while the second input E2 of each logic cell of odd row [i, 1] wherein 3<i<d and i=2 K+1 with K∈N, is connected to the second output S2 of the logic cell [i−1, 2],
    the second output S2 of each logic cell of an even row [i, 1] wherein 2<i<d and i=2 K and K∈N, is connected to the second input E2 of the logic cell [i−1, 2] while the second output S2 of each logic cell of odd row [i, 1] wherein 3<i<d and i=2 K+1 with K∈N is connected to the second input E2 of this logic cell [i+1, 2].
  for connections of the first row:
    the second input E2 of the logic cell [1, 1] being connected to the second output S2 of the logic cell [1, 2] while the second output S2 of the cell [1, 1] is connected to the second input E2 of the cell [2, 2],
    the second input E2 of the logic cell [1, 2] being connected to the second output S2 of the logic cell [2, 1],
  for connections of the last row if d=2 K with K∈N:
    the second input E2 of the logic cell [d, 1] being connected to the second output S2 of the logic cell [d, 2] being connected to the second output S2 of the logic cell [d, 2] while the second output S2 of the logic cell [d, 1] is connected to the second input E2 of the logic cell [d−1, 2],
    the second input E2 of the logic cell [d, 2] being connected to the second output S2 of the logic cell [d−1, 1],
  for the connections of the last row if d=2 K+1 with K∈N:
    the second input E2 of the logic cell [d, 1] is connected to the second output S2 of the logic cell [d−1, 2] while the second output S2 of the logic cell [d, 1] is connected to the second input E2 of the logic cell [d, 2],
    the second output S2 of the logic cell [d, 2] being connected to the second input E2 of the logic cell [d−1, 1].

According to this first embodiment, it is possible to obtain depending on the number of addressed logic cells a logic depth, i.e. the number of logic operations carried out in cascade and in total, comprised between 1 and 2×d.

Similarly, for the second embodiment illustrated in FIG. 2, i.e. for an array including a number d of rows i equal to 2 (d=2) and a number w of columns j with w≥2, the intersecting interconnection topology is such that:
  for internal connections:
    the second input E2 of each logic cell of even column [1, j] wherein 2<j<w and j=2 K and K∈N, is connected to the second output S2 of the logic cell [2, j−1] while the second input E2 of each logic cell of odd column [1, j] wherein 3<j<d and j=2 K+1 with K∈N, is connected to the second output S2 of the logic cell [2, j+1],
    the second output S2 of each logic cell of even column [1, j] wherein 2<j<w and j=2 K and K∈N, is connected to the second input E2 of the logic cell [2, j+1] while the second output S2 of each logic cell of odd column [1, j] wherein 3<j<w and j=2 K+1 with K∈N, is connected to the second input E2 of the logic cell [2, j−1],
  for connections of the first column:
    the second input E2 of the logic cell [1,1] being connected to the second output S2 of the logic cell [2,2] while the second output S2 of the logic cell [1,1] is connected to the second input E2 of the logic cell [2,1],
    the second output S2 of the logic cell [2,1] being connected to the second input E2 of the logic cell [1,2],
  for connections of the last column if w=2 K with K∈N:
    the second input E2 of the logic cell [1, w] being connected to the second output S2 of the logic cell [2, w−1] while the second output S2 of the logic cell [1, w] is connected to the second input E2 of the logic cell [2, w],
    the second output S2 of the logic cell [2, w] being connected to the second input E2 of the logic cell [1, w−1],
  for connections of the last column if w=2 K+1 with K∈N:
    the second input E2 of the logic cell [1, w] is connected to the second output S2 of the logic cell [2, w] while the second output S2 of the logic cell [1, w] is connected to the second input S2 of the logic cell [2, w−1],
    the second input E2 of the logic cell [2, w] being connected to the second output S2 of the logic cell [1, w−1].

According to this second embodiment, it is possible to obtain depending on the number of addressed logic cells, a logic depth, i.e. the number of logic operations in cascade carried out in total, comprised between 1 et 2×w.

As this is clearly apparent from FIGS. 1 and 2, the array according to the invention provides great facility for accessing the input/outputs of the logic cells taking into account their distribution along the whole periphery of the array, with no preference for a direction but allowing access along both directions of the array thereby limiting the access times. This intersecting and oscillating or twisted connection topology provides multiple possibilities for configuration and for calculation with reduced connection paths between the logic cells as this will be illustrated according to exemplary embodiments which follow.

Figure 3:
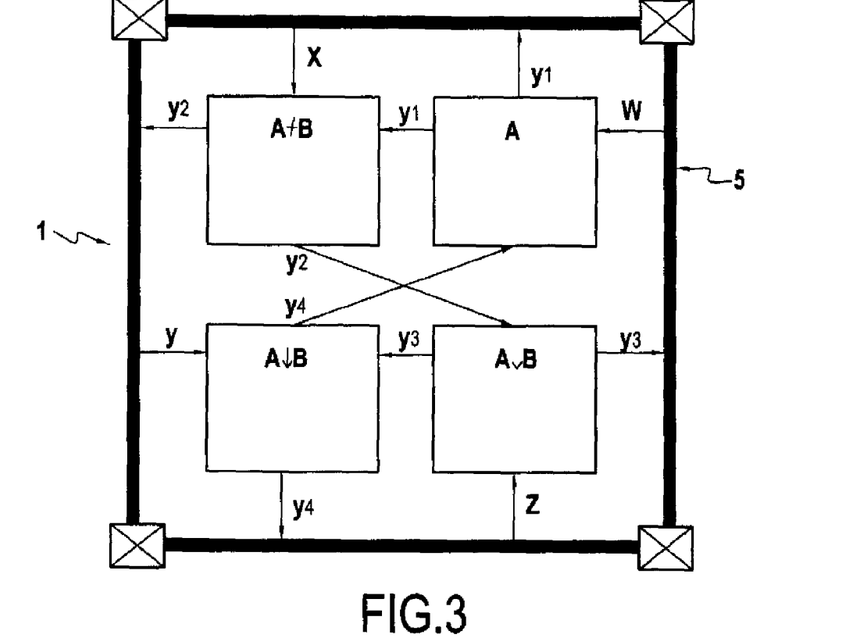
FIG. 3 illustrates a first exemplary application of an interconnected array according to the invention including two rows and two columns, i.e. four logic cells.

FIG. 3 illustrates a first exemplary application of an interconnected array 1 according to the invention including two rows (d=2) and two columns (w=2) i.e four logic cells marked as [1,1], [1,2], [2,1] and [2,2] (the numbering of the columns j and of the rows i of the array being from the top on the left and going from left to right for the columns and from top to bottom for the rows).

According to this exemplary embodiment, the array achieves the global logic function y such that $y=\neg((X \mathbin{/} W) \vee Z \vee Y)$. The four logic cells are configured so as to respectively achieve the following functions: $[1,1]=A \mathbin{/} B$, $[1,2]=A$, $[2,1]=A \downarrow B$, $[2,2]=A \vee B$. In this example, it is assumed that the datum W is associated with the first input of the logic cell [1,2], the datum X to the first input of the logic cell [1,1], the datum Y to the first input of the logic cell [2,1] and the datum Z to the first input of the logic cell [2,2].

Figure 4:
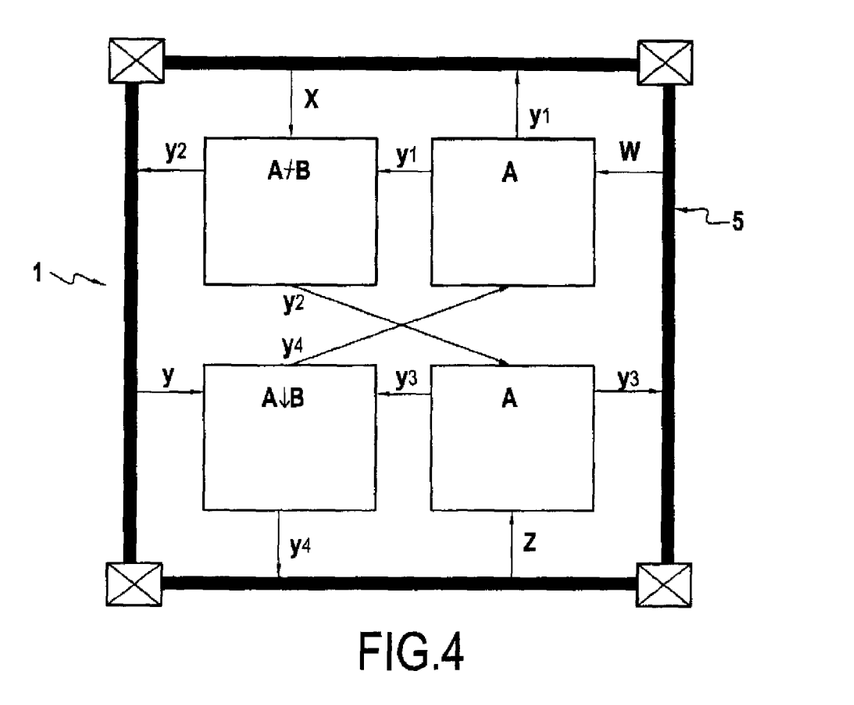
FIG. 4 illustrates an alternative application of the interconnected 2×2 array illustrated in FIG. 3.

The first outputs of the logic cells [1,2], [1,1], [2,2], [2,1] are respectively designated by $y_1, y_2, y_3, y_4$. The first input of each logic cell in the array corresponds to the operand A in the individual function, the second input (from the output of another cell in the array) corresponds to the operand B in the same function. The overall function thus consists therein in executing four individual logic functions $A \mathbin{/} B, A, A \downarrow B, A \vee B$, of the cascade type if the cells are of a static combinatory logic nature, or of the piperow type if the operation of the logic cells depends on an external clock signal. The execution takes place according to the following principle:

1. $y_1 = W$
2. $y_2 = X \mathbin{/} y_1 = X \mathbin{/} W$
3. $y_3 = Z \vee y_2 = (X \mathbin{/} W) \vee Z$
4. $y_4 = Y \downarrow y_3 = \neg(Y \vee y_3) = \neg((X \mathbin{/} W) \vee Z \vee Y) = y$ The flexibility of the invention may also be illustrated if two independent functions $y_A = X \mathbin{/} W$ and $y_B = Z \downarrow Y$ are now considered (for simplicity, it is used as illustrated in FIG. 4, the same configuration of the array illustrated in FIG. 3 except for the logic cell [2,2]=A). It is clear that the achievement of $y_A$ corresponds to the output $y_2$:

1. $y_1 = W$
2. $y_2 = X \mathbin{/} y_1 = X \mathbin{/} W = Y_A$

And that the achievement of $y_B$ corresponds to the output $y_4$

1. $y_3 = Z$
2. $y_4 = Y \downarrow y_3 = Z \downarrow Y = Y_B$.

The array according to the invention thus allows simultaneous execution of several different or even identical functions.

Figure 5:
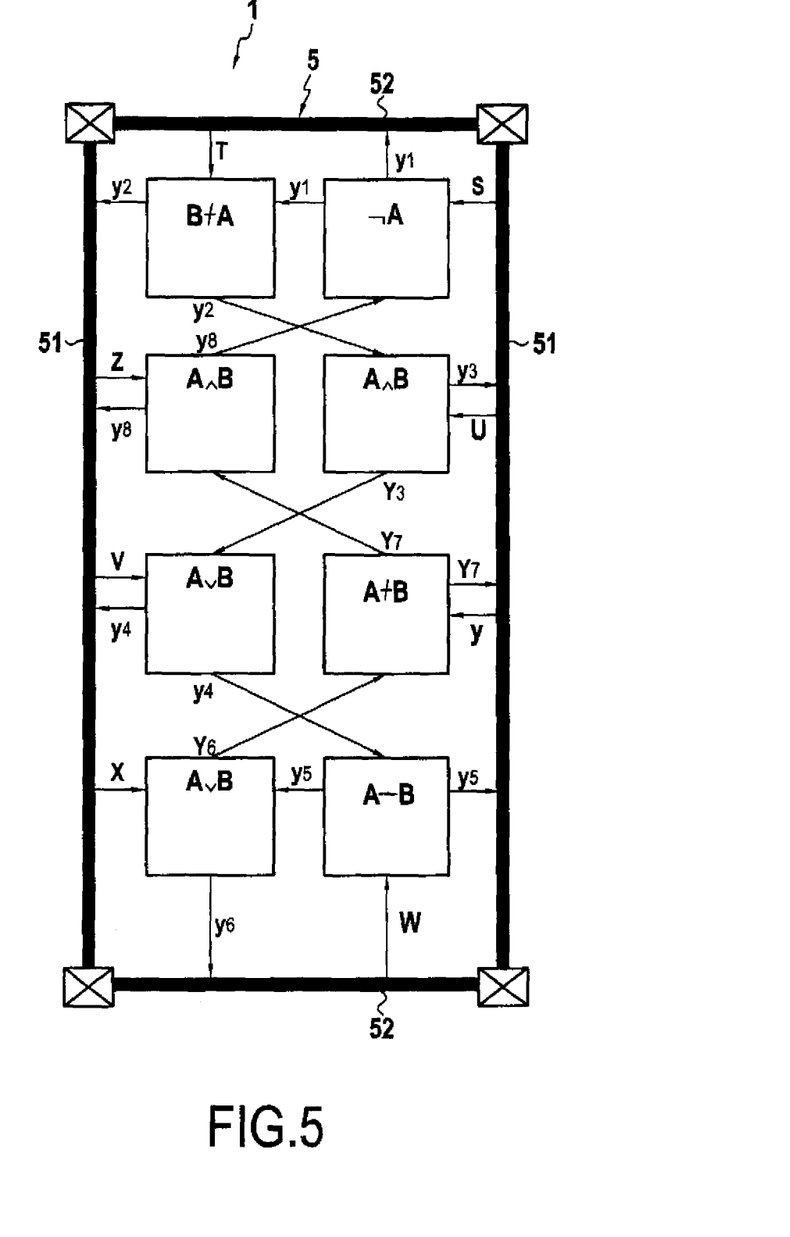
FIG. 5 illustrates a second exemplary application of an interconnected array according to the invention including four rows and two columns, i.e. eight logic cells.

FIG. 5 illustrates a second exemplary application of an interconnected array 1 according to the invention including four rows (d=4) and 2 columns (w=2) i.e. eight logic cells marked as [1, 1], [1, 2], [2, 1] ,[2, 2],[3, 1], [3, 2], [4, 1], [4, 2] (the numbering of the columns j and of the rows i of the array always starting from top on the left and going from left to right for the columns and for top to bottom for the rows).

According to this exemplary embodiment, the array achieves the global logic function y such that $g = \neg((\neg S \wedge \wedge T \neg U) \vee V \neg \wedge W \wedge X) \vee Y \wedge Z$. The eight logic cells are configured so as to respectively perform the following logic functions: $[1, 1]=B \mathbin{/} A$, $[1, 2]=\neg$, $[2, 1]=A \vee B$, $[2, 2]=A \wedge B$, $[3, 1]=A \vee B$, $[3, 2]=A \mathbin{/} B$, $[4, 1]=A \vee B$, $[4, 2]=A \rightarrow B$. In this example, it is assumed that the datum S is associated with the first input of the logic cell [1, 2], the datum U to the first input of the logic cell [2, 2], the datum Y with the first input of the logic cell [3, 2], the datum W with the first input of the logic cell [4, 2], the datum T with the first input of the logic cell [1, 1], the datum Z with the first input of the logic cell [2, 1], the datum V to the first input of the logic cell [3, 1], the datum X with the first input of the logic cell [4, 1].

Figure 6:
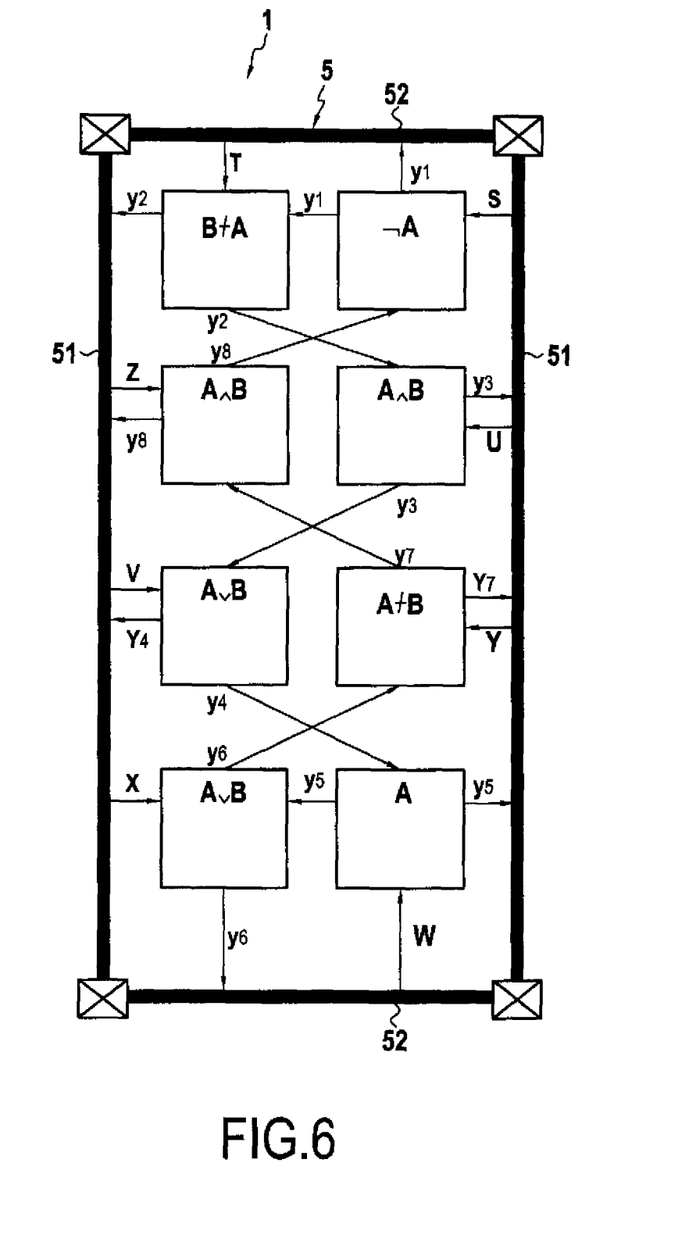
FIG. 6 illustrates an alternative application of the interconnected 4×2 array illustrated in FIG. 5.

The first outputs of the logic cells [1, 2], [1, 1], [2, 2], [3, 1], [4, 2], [4, 1], [3, 2], [2, 1] are respectively designated by $y_1, y_2, y_3, y_4, y_5, y_6, y_7, y_8$. The first input of each logic cell in the array corresponds to the operand A in the individual function, the second input (stemming from the output of another logic cell in the array) corresponds to the operand B in the same function. The global function thus consists therein in an execution of eight individual logic functions, of the cascade type if the logic cells are of a static combinatorial logic nature, or of the piperow type if the operation of the cells depends on an external clock signal. The execution occurs according to the following principle:

1. $y_1 = \neg S$
2. $y_2 = y_1 \mathbin{/} T = \neg S \mathbin{/} T = \neg S \wedge \neg T$
3. $y_3 = U \neg y_2 = \wedge S \wedge \neg T \wedge U$
4. $y_4 = V \neg y_3 = (\vee S \wedge S \wedge \neg T \wedge U) \vee$
5. $y_5 = W \rightarrow \neg y_4 = (\neg S \wedge \wedge T \wedge U) \vee V \neg \neg W$
6. $y_6 = X \neg y_5 = (\vee S \wedge \wedge T \vee U) \vee V \neg \neg W \vee X$
7. $y_7 = Y \mathbin{/} y_6 = \neg((\wedge S \vee \wedge T \vee U) \vee V \wedge \neg W \neg X) \neg Y$
8. $y_8 = Z \neg y_7 = \neg((\neg S \wedge \wedge T \vee U) \wedge V \wedge \wedge W \vee X) \neg Y \neg Z = y$ The flexibility of the invention may also be illustrated if now two independent functions $y_A = (\neg S \wedge \wedge T \vee U) \neg V$ and $y_B = \neg (\vee W \vee X) \wedge Y \wedge Z$ are considered (for simplicity, it is used as illustrated in FIG. 6, the same configuration of the array illustrated in FIG. 5 except for the logic cell [4, 2]=A). It is clear that the achievement of $y_A$ corresponds to the output $y_4$:

1. $y_1 = \neg S$
2. $y_2 = y_1 \mathbin{/} T = \neg S \mathbin{/} T = \neg S \wedge \neg T$
3. $y_3 = U \neg y_2 = \wedge S \wedge \neg T \wedge U$
4. $y_4 = V \neg y_3 = (\vee S \wedge \wedge T \neg U) \vee V$ And that the achievement of $y_B$ corresponds to the output $y_8$ 1. $y_5 = \neg W$
2. $y_6 = X \vee y_5 = \neg W \vee X$
3. $y_7 = Y \mathbin{/} y_6 = \neg(\neg W \vee X) \wedge Y$
4. $y_8 = Z \neg y_7 = \neg(\wedge W \vee X) \wedge Y \wedge Z = y$.

Of course, the examples described above are not limiting and the object of the invention may be applied for the second embodiment in a similar way.

The invention is not limited to the described and illustrated examples since various modifications may be made thereto without departing from the scope thereof.

The invention claimed is:

1. An interconnected array of reconfigurable logic cells carrying out at least one logic function (F), externally connected to peripheral connection network (5) equipped with switch boxes (6) and connected to programmable input/output blocks, characterized in that the logic cells [i, j] are distributed along a first dimension in rows i with i=1 to d and along a second dimension in columns j with j=1 to w, with d≥2 and w=2 or d=2 and w≥2, each logic cell including a first input (E1), a second input (E2), a first output (S1) and a second output (S2), the first input (S1) of each logic cell and the first output (S1) of each logic cell being connected to the connecting network (5), the second input (E1) and the second output (S2) of each logic cell being connected to other different column and row logic cells except for the first and last rows of columns for d>2 or w>2 respectively, through an intersection interconnecting topology between both columns of the array for w=2 and between both rows of the array for d=2 and successively oscillating along one direction and along one reverse direction, so that the logic depth of the logic functions (F) is comprised between 1 and 2×d or between 1 and 2×w;
  wherein the connecting network (5) includes two sides (51) for connection with the rows (i) thus extending on either side of the first and second columns of the array on the one hand and two sides (52) for connection with the columns (j) thus extending on either side of the first and last rows (i) of the array;
  wherein for d>2, the first input (E1), and the first output (S1) of each logic cell belonging to a same column, except for the logic cells of the first row and of the last row, are connected to the side (51) for connection with the rows close to said column while for w>2, the first input (E1) and the first output (S1) of each logic cell belonging to a same row, except for the logic cells of the first and of the last column, are connected to the side (52) for connection with the columns, close to said row; and
  wherein the first input (E1) and the first output (S1) of each logic cell of the first and last rows for d>2 and of the first and last columns for w>2 are respectively connected to the neighboring side (51) for connection with the rows and to the neighboring side (52) for connection with the columns.

2. The interconnected array according to claim 1, characterized in that it includes for a number (d) of rows (i) with d≥2 and a number (w) of columns equal to 2, the intersecting interconnection topology such that:
  for internal connections:
    the second input (E2) of each logic cell of an even row [i, 1] wherein 2<i<d and i=2 K and K∈N, is connected to the second output (S2) of the logic cell [i+1, 2] while the second input (E2) of each logic cell of odd row [i, 1] wherein 3<i<d and i=2 K=+1 with K∈ N, is connected to the second output (S2) of the logic cell [i−1, 2],
    the second output (S2) of each logic cell of an even row [i, 1] wherein 2<i<d and i=2 K and K∈ N, is connected to the second input (E2) of the logic cell [i−1, 2] while the second output (S2) of each logic cell of odd row [i, 1] wherein 3<i<d and i=2 K+1 with K∈ N is connected to the second input (E2) of cell [i+1, 2],
  for connections of the first row:
    the second input (E2) of the logic cell [1, 1] being connected to the second output (S2) of the logic cell [1, 2] while the second output (S2) of the cell [1, 1] is connected to the second input (E2) of the cell [2, 2],
    the second input (E2) of the logic cell [1, 2] being connected to the second output (S2) of the logic cell [2, 1],
  for connections of the last row if d=2 K with K∈N:
    the second input (E2) of the logic cell [d, 1] being connected to the second output (S2) of the logic cell [d, 2] while the second output (S2) of the logic cell [d, 1] is connected to the second input (E2) of the logic cell [d−1, 2],
    the second input (E2) of the logic cell [d, 2] being connected to the second output (S2) of the logic cell [d−1, 1],
  for connections of the last row if d=2 K+1 with K∈N:
    the second input (E2) of the logic cell [d, 1] is connected to the second output (S2) of the logic cell [d−1, 2] while the second output (S2) of the logic cell [d, 1] is connected to the second input (E2) of the logic cell [d, 2],
    the second output (S2) of the logic cell [d, 2] being connected to the second input (E2) of the logic cell [d−1, 1].

3. The interconnected array according to claim 1, characterized in that it includes for a number (d) of rows (i) with d=2 and a number (w) of columns (j) with w≥2, the intersecting interconnecting topology such that:
  for internal connections:
    the second input (E2) of each logic cell of an even column [1, j] wherein 2<j<w and j=2 K and K∈N, is connected to the second output (S2) of the logic cell [2, j−1] while the second input (E2) of each logic cell of odd column [1, j] wherein 3<j<d and j=2 K +1 with K∈N, is connected to the second output (S2) of the logic cell [2, j+1],
    the second output (S2) of each logic cell of an even column [1, j] wherein 2<j<w and j=2 K and K∈N, is connected to the second input (E2) of the logic cell [2, j+1] while the second output (S2) of each logic cell of an odd column [1, j] wherein 3<j<w and j=2 K +1 with K∈N is connected to the second input (E2) of cell [2, j−1],
  for connections of the first column:
    the second input (E2) of the logic cell [1, 1] being connected to the second output (S2) of the logic cell [2, 2] while the second output (S2) of the cell [1, 1] is connected to the second input (E2) of cell [2, 1],
    the second output (S2) of the logic cell [2, 1] being connected to the second input (E2) of the logic cell [1, 2],
  for connections of the last column if w=2 K with K∈N:
    the second input (E2) of the logic cell [1, w] being connected to the second output (S2) of the logic cell [2, w−1] while the second output (S2) of the logic cell [1, w] is connected to the second input (E2) of the logic cell [2, w],
    the second output (S2) of the logic cell [2, w] being connected to the second input (E2) of the logic cell [1, w−1],
  for connections of the last column if w=2 K+1 with K∈N:
    the second input (E2) of the logic cell [1, w] is connected to the second output (S2) of the logic cell [2, w] while the second output (S2) of the logic cell [1, w] is connected to the second input (E2) of the logic cell [2, w−1], the second input (E2) of the logic cell [2, w] being connected to the second output (S2) of the logic cell [1, w−1].

4. The interconnected array according to claim 1, characterized in that each logic cell achieves at least one logic function taken from negation, conjunction, disjunction, NAND, NOR, XOR, XNOR, implication or non-implication functions.

5. The interconnected array according to claim 4, characterized in that all the logic cells of the array are identical.

6. The interconnected array according to claim 1, characterized in that the connecting network (5) is equipped with switch boxes (6).

7. An integrated circuit characterized in that it includes at least one interconnected array (1) according to claim 1.

* * * * *